United States Patent [19]

Fujioka

[11] Patent Number: 4,964,208

[45] Date of Patent: Oct. 23, 1990

[54] PARTS EXCHANGE MECHANISM OF CHIP MOUNTER

[75] Inventor: Teruhiko Fujioka, Tokyo, Japan

[73] Assignee: Tenryu Technics Co., Ltd., Shizuoka, Japan

[21] Appl. No.: 357,710

[22] Filed: May 25, 1989

[30] Foreign Application Priority Data

May 30, 1988 [JP] Japan .............................. 63-71510[U]

[51] Int. Cl.$^5$ ............................................ B23Q 3/155
[52] U.S. Cl. ........................................................ 29/568
[58] Field of Search ................................. 29/568, 26 A

[56] References Cited

U.S. PATENT DOCUMENTS 4,770,599 9/1988 Hawkswell ......................... 29/568 X
4,790,053 12/1988 Godbecker ......................... 29/568 X Primary Examiner—William Briggs
Attorney, Agent, or Firm—Rodman & Rodman

[57] ABSTRACT

A parts exchange mechanism of a chip mounter, capable of automatically exchanging parts such as a suction bit for sucking chip-shaped electronic parts to be mounted onto a printed circuit board, and a positioner for centering the same. The part exchange mechanism comprises: holding means for holding the parts to be exchanged on the side of the chip mounter; receiving and delivering means for receiving the parts from the holding means and delivering same thereto; clamp means capable of clamping and releasing the parts; and an actuator for causing the clamp means to clamp and release. A parts exchange mechanism capable of automatically and simultaneously exchanging plurality of parts of a chip mounted is also provided.

4 Claims, 3 Drawing Sheets

PARTS EXCHANGE MECHANISM OF CHIP MOUNTER

BACKGROUND OF THE INVENTION

1. Field of the Invention

The present invention relates to a parts exchange mechanism of a chip mounter, and particularly to techniques of exchanging parts of a chip mounter, such as a suction bit for sucking electronic parts, and a positioner for centering and positioning the electronic parts. These electronic parts are chip-shaped electronic parts such as semiconductor chips and mounted onto a printed circuit board by the chip mounter.

2. Related Art Statement

In general, there are a multiplicity of types of chip-shaped electronic parts differing in dimensions and shapes from one another. In order to mount the chip-shaped electronic parts having the multiplicity of types onto the printed circuit boards by one chip mounter, it is necessary to exchange, at least, a suction bit for sucking the chip-shaped electronic parts and a positioner for centering the chip-shaped electronic parts, in accordance with the dimensions and shapes of the electronic parts to be mounted.

To this end, in the common practice of the art, chip mounting work was temporarily suspended, and a suction bit and a positioner were changed separately by hand.

However, when there are many types of electronic parts to be mounted, it was extremely troublesome and complicated to manually carry out exchange of parts such as the suction bit and the positioner in accordance with the type of electronic parts mounted. Thus, efficiency of parts exchanging of the chip mounter were lowered, being great obstacle to automate chip mounting work from beginning to end.

SUMMARY OF THE INVENTION

It is an object of the present invention to provide a technique capable of automatically carrying out exchange of a suction bit, a positioner and the like of the chip mounter.

It is another object of the present invention to provide a technique capable of simultaneously carrying out exchange of a suction bit and a positioner of the chip mounter.

A parts exchange mechanism of a chip mounter according to the present invention is a mechanism for exchanging parts such as a suction bit and a positioner of a chip mounter, comprising:

holding means for holding parts to be exchanged on the side of the chip mounter;

receiving and delivering means for receiving the parts to be exchanged from the holding means and delivering the same thereto;

clamp means capable of clamping and releasing the parts to be exchanged; and an actuator for causing the parts clamp means to clamp and release;

wherein: the clamp means is actuated by the operation of the actuator; and receiving and delivering of the parts to be exchanged between the holding means and the receiving and delivering means and exchange of the parts to be exchanged are automatically carried out.

Another parts exchange mechanism of a chip mounter according to the present invention is a parts exchange mechanism for exchanging a suction bit and a positioner of the chip mounter, comprising:

a suction bit holding member and a positioner holding member respectively provided on a mounter head of the chip mounter so as to hold the suction bit and the positioner, respectively;

a collet chuck for holding the suction bit, which receives the suction bit from the suction bit holding member and delivers the same thereto;

a chuck sleeve for applying a clamping force to the collet chuck or releasing the force therefrom so as to cause the collet chuck to clamp or release the suction bit;

a first rod connected to the chuck sleeve;

a first actuator for causing the first rod to move in its axial direction;

a piston member connected to the collet chuck and capable of moving in its axial direction so as to receive the positioner from the positioner holding member and deliver the same thereto while holding the positioner;

clamp pawls rocking about a pin so as to clamp or release the positioner held by the piston member;

a clamp pawl rocking means connected to the chuck sleeve, for applying a rocking force to the clamp pawls;

a post member connected to the piston member and the first actuator; and a second actuator for causing the first actuator to operate in its axial direction.

By use of the former mechanism described above, the parts to be exchanged such as the suction bit and the positioner of the chip mounter are fully automatically exchanged without the need of hand work, so that the efficiencies of the parts exchange work and the chip mounting work can be improved.

Furthermore, by use of the latter mechanism described above, the suction bit and the positioner of the chip mounter are automatically exchanged at the same time, so that the working efficiencies can be further improved.

DETAILED DESCRIPTION OF THE INVENTION

Figure 1:
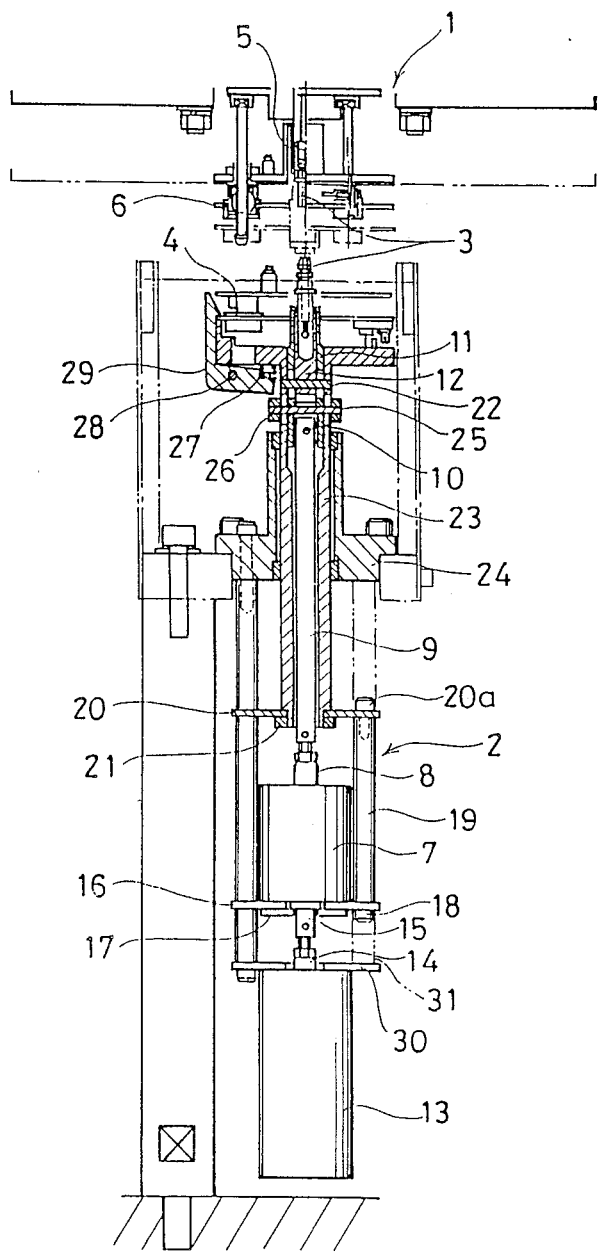
FIG. 1 is a sectional view showing an embodiment of parts exchange mechanism according to the present invention.
Figure 2:
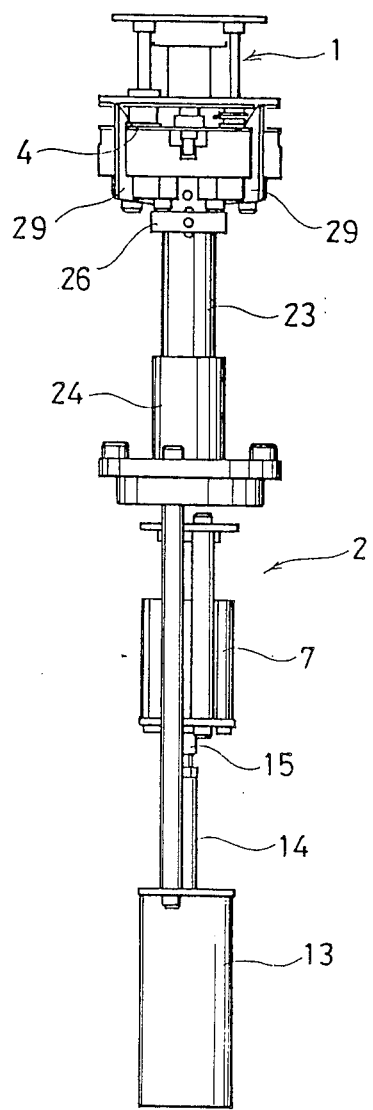
FIGS. 2 and 3 are front views for explaining the states of operation thereof.
Figure 3:
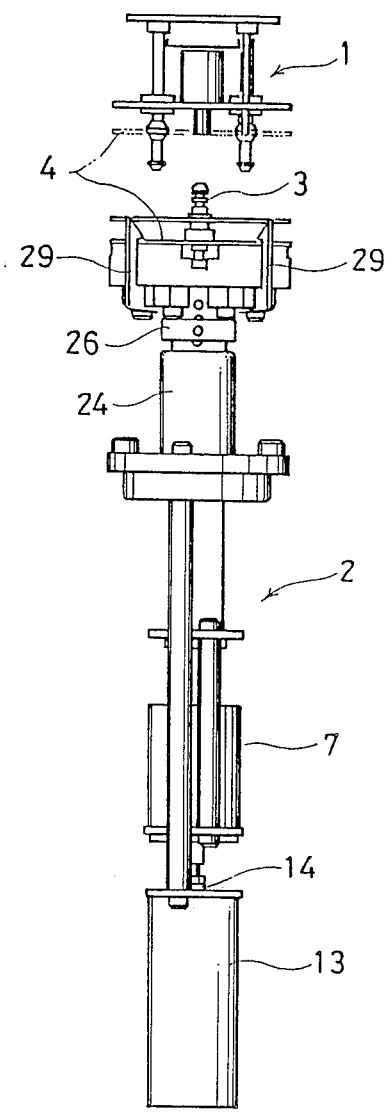

In this embodiment, reference numeral 1 denotes a mounter head of a chip mounter, and 2 a parts exchange mechanism.

The mounter head 1 of the chip mounter has a suction bit holding member 5 (a first holding means) for holding a suction bit 3 and a positioner holding member 6 (a second holding means) for holding a positioner 4.

Simultaneous and automatic exchange of the suction bit 3 and the positioner 4 can be carried out by the parts exchange mechanism 2 of this embodiment.

Accordingly, a parts exchange structure for the suction bit 3 and a parts exchange structure for the positioner 4 are interlockingly constructed for operation.

First, the parts exchange structure for the suction bit 3 will be described. The parts exchange structure for the suction bit 3 has: a first air cylinder 7 as being a first actuator; a first rod 9 connected and fixed to the top end of a cylinder rod 8 of the first air cylinder 7; a chuck sleeve 11 connected to the top end of the first rod 9 by means of a pin 10; and a collet chuck 12 (a clamp means) inserted into the top end portion of the chuck sleeve 11 in the vertical direction, the upper portion of the collet chuck 12 is vertically split so that the upper portion thereof opens or closes in response to the vertical movement of the chuck sleeve 11 due to a tapered type chuck construction thereof so as to clamp or release the suction bit 3 (parts to be exchanged).

On the other hand, the parts exchange structure for the positioner 4 includes: a second air cylinder 13 as being a second actuator; a second rod 15 connected and fixed to the top end of a cylinder rod 14 of the second air cylinder 13, for pushing up the first air cylinder 7 by the operation of the second air cylinder 13; plates 16 and 17 fixed to the undersurface of the first air cylinder 7; a post 19 connected and fixed to the plate 16 by means of a bolt 18; a plate 20 connected to the top end of the post 19 by means of a bolt 20a; a piston member 23 connected and fixed at the bottom end thereof to the inner periphery of the plate 20 by means of a nut 21, and connected and fixed at the top end thereof to the collet chuck 12 by means of a pin 22, extending vertically outwardly of the first rod 9, and mounted at the top surface thereof with the positioner 4 which is to be received from and delivered to the positioner holding member 6; a cylinder member 24 for guiding the vertical movement of the piston member 23; a ring 26 (a clamp pawl rocking means) connected and fixed to the chuck sleeve 11 by means of a pin 25; and four (for example) generally L-shaped clamp pawls 29 (a clamp means) adapted to rock about a pin 28 in response to the vertical movement of the ring 26 and a biasing force of a spring 27 to thereby clamp or release the positioner 4 held on the piston member 23.

In addition, a plate 30 and a post 31 are connected to the top end of the second air cylinder 13.

Action of this embodiment will hereunder be described.

First, the description is given of a case where the suction bit 3 and the positioner 4 are respectively mounted onto the suction bit holding member 5 and the positioner holding member 6 of the mounter head 1 of the chip mounter, by the parts exchange mechanism 2.

First, when the first air cylinder 7 is driven to raise the cylinder rod 8, the first rod 9 mounted on the forward end (top end) of the cylinder rod 8, the chuck sleeve 11 fixed to the first rod 9 by means of the pin 10 and the ring 26 fixed to the chuck sleeve 11 by means of the pin 25 are raised. As the ring 26 rises, the clamp pawls 29 are rotated about the pin 28 in the counterclock-wise direction against the biasing force of the spring 27, the upper end potions of clamp pawls are opened as indicated by arrows, and the positioner 4 mounted on the top surface of the piston member 23 is released.

On the other hand, as the chuck sleeve 11 rises, the upper portion of the collet chuck 12 flares resiliently to thereby release the suction bit 3.

Subsequently, the mounter head 1 not holding the positioner 4 by means of the holding members 5 and 6 is positioned upwardly of the suction bit 3 and the positioner 4 which were released as described above.

In this state, when the second air cylinder 13 is driven to raise the cylinder rod 14, the second rod 15 fixed to the cylinder rod 14 rises to push up the undersurface of the first cylinder 7. Since the first air cylinder 7, the plate 16, the post 19, the plate 20 and the piston member 23 are fastened to one another, the piston member 23 rises while being guided by the inside diameter of the cylinder member 24 as the first air cylinder 7 is pushed up.

As a result, the positioner 4 mounted on the top surface of the piston member 23 and the suction bit 3 inserted into the collet chuck 12 fixed to the piston member 23 by means of the pin 22 are raised together with the piston member 23, delivered to the suction bit holding member 5 and the positioner holding member 6 which are provided on the mounter head 1, respectively, and held thereby.

Subsequently, when the second air cylinder 13 is driven to draw in the cylinder rod 14, the second rod 15 fixed to the cylinder rod 14 is lowered to pull down the plate 17.

Since the plate 16, the plate 17, the post 19, the plate 20 and the piston member 23 are fastened to one another, the piston member 23 and the collet chuck 12 fixed to the piston member 23 by means of the pin 22 are pulled down as the plate 17 is lowered.

At this time, since the clamp pawls 29 and the collet chuck 12 are still in the released states, the suction bit 3 and the positioner 4 remain in the mounter head 1 while being held by the respective holding members 5 and 6. With this operation, mounting of the suction bit 3 and the positioner 4 onto the mounter head 1 is carried out fully automatically and simultaneously.

Next, the description is given of a case where the suction bit 3 and the positioner 4 are simultaneously and automatically removed from the mounter head 1.

First, the mounter head 1 is positioned upwardly of the piston member 23 being in a state where the suction bit 3 and the positioner 4 are not mounted or held thereon.

After this positioning, the mounter head 1 is driven by a driving means, not shown, to bring the suction bit 3 held by the suction bit holding member 5 into a lowered state, and to bring the positioner 4 held by the positioner holding member 6 into a released state.

In this state, when the second air cylinder 13 of the parts exchange mechanism 2 is driven to raise the cylinder rod 14 thereof, the second rod 15 connected and fixed to the cylinder rod 14 is raised to push up the undersurface of the first air cylinder 7.

Since the first air cylinder 7, the plate 16, the post 19, the plate 20 and the piston member 23 are fastened to one another, the piston member 23 rises while being guided by the inside diameter of the cylinder member 24 as the first air cylinder 7 is pushed up.

By this rise of the piston member 23, the piston member 23 receives the positioner at the upper surface thereof, while, the collet chuck 12 connected and fixed to the piston member 23 by means of the pin 22 also rises together with the piston member 23 and the inner diametral surface of the collet chuck 12 receives the outer shape of the suction bit 3.

Thereafter, when the first air cylinder 7 is driven to draw in the cylinder rod 8 thereof, the first rod 9 fixed to the top end of the cylinder rod 8, the chuck sleeve 11 connected and fixed to the first rod 9 by means of the pin 10 and the ring 26 connected and fixed to the chuck sleeve 11 by means of the pin 25 are lowered.

As the ring 26 is lowered, the clamp pawls 29 are rotated about the pin 28 in the clock-wise direction by the biasing force of the spring 27 to clamp the positioner 4 mounted on the top surface of the piston member 23 as shown in FIG. 1.

At the same time as this, the chuck sleeve 11 is lowered and the collet chuck 12 is closed due to the tapered type chuck construction thereof to clamp the suction bit 3 which has been received in the inside diameter of the collet chuck 12 from outside.

Subsequently, when the second air cylinder 13 is driven to draw in the cylinder rod 14 thereof, the second rod 15 connected and fixed to the cylinder rod 14 is lowered to pull down the plate 17.

Since the plate 16, the plate 17, the post 19, the plate 20 and the piston member 23 are fastened to one another, the piston member 23 and the collet chuck 12 connected and fixed to the piston member 23 by means of the pin 22 are lowered as the plate 17 is pulled down.

At this time, since the collet chuck 12 and the clamp pawls 29 are clamping the suction bit 3 and the positioner 4, respectively, the suction bit 3 and the positioner 4 are held in the inside diameter of the collet chuck 12 and on the top surface of the piston member 23, respectively, and simultaneously and automatically removed from the suction bit holding member 5 and the positioner holding member 6 of the mounter head 1, respectively.

With this operation, removal of the suction bit 3 and the positioner 4 from the mounter head 1 is automatically and simultaneously completed.

Accordingly, in this embodiment, the suction bit 3 and the positioner 4 of the chip mounter can be simultaneously and fully automatically mounted onto the holding members 5 and 6 and removed therefrom by use of the parts exchange mechanism 2, so that the parts exchange can be carried out highly efficiently for a very short time.

Although the parts exchange mechanism 2 in this embodiment is an automatic parts exchange mechanism having multiple functions, the component parts thereof are intensively arranged in straight and compact manner in the longitudinal direction, so that the parts exchange mechanism is advantageous in terms of space efficiency. Moreover, the parts exchange mechanism as a whole constitutes an independent station, so that additional installations of a plurality of parts exchange mechanisms can be easily carried out.

Incidentally, the present invention is not limited to the above embodiment, and various other modifications can be adopted.

Furthermore, the present invention may be applied to the exchange of the component parts of the chip mounter other than the suction bit and the positioner.

According to the present invention, the following excellent functional effects can be achieved.

(1) Component parts such as the suction bit and the positioner of a chip mounter can be fully automatically exchanged, so that there is no need of carrying out parts exchange by hand work while stopping operation of the chip mounter, thus considerably improving the efficiency of parts exchange.

(2) The suction bit and the positioner are exchanged simultaneously, so that the efficiency of parts exchange working can be further improved and parts exchange can be carried out for a very short time.

(3) According to the above-described items (1) and (2), the chip mounting work can be carried out automatically from beginning to end.

(4) Furthermore, according to the above-described items (1) and (2), electronic parts such as the semiconductor chip parts having the multiplicity of types which differ in dimensions and shapes can be mounted onto the printed circuit board by one chip mounter at high efficiency and with safety.

What is claimed is:

1. A parts exchange mechanism of a chip mounter, for exchanging a suction bit and a positioner of the chip mounter, comprising:

a suction bit holding member and a positioner holding member respectively provided on a mounter head of the chip mounter so as to hold said suction bit and said positioner, respectively;

a collet chuck for holding said suction bit, which receives said suction bit from said suction bit holding member and delivers same thereto;

a chuck sleeve for applying a clamping force to said collet chuck or releasing same therefrom so as to cause said collet chuck to clamp or release said suction bit;

a first rod connected to said chuck sleeve;

a first actuator for causing said first rod to move in its axial direction;

a piston member connected to said collet chuck and capable of moving in its axial direction so as to receive said positioner from said positioner holding member and deliver same thereto while holding said positioner;

clamp pawls rocking about a pin so as to clamp or release said positioner held by said piston member;

a clamp pawl rocking means connected to said chuck sleeve, for applying a rocking force to said clamp pawls;

a post member connected to said piston member and said first actuator; and a second actuator for causing said first actuator to move in its axial direction.

2. The parts exchange mechanism of a chip mounter according to claim 1, wherein said first and second actuators are air cylinders.

3. The parts exchange mechanism of a chip mounter according to claim 1, wherein said second actuator pushes up said first actuator from below through a second rod.

4. A part exchange mechanism of a chip mounter, for exchanging such parts as a suction bit and a positioner of the chip mounter, comprising:

holding means for holding the parts to be exchanged on one side of the chip mounter;

receiving means for receiving the parts to be exchanged from said holding means, said receiving means including means for delivering said parts to be exchanged to said holding means;

said holding means further including clamp means capable of clamping and releasing the parts to be exchanged; and an actuator for causing said clamp means to clamp and release the parts to be exchanged;

and wherein the parts to be exchanged are the suction bit and the positioner of the chip mounter, and wherein a separate said holding means, a separate said receiving means, a separate said delivery means, a separate said clamp means, and a separate said actuator are respectively provided for each of the suction bit and the positioner and are adapted to cooperate such that the suction bit and the positioner are simultaneously and automatically exchange.

* * * * *